(12) United States Patent
Kinjo

(10) Patent No.: US 12,185,595 B2
(45) Date of Patent: Dec. 31, 2024

(54) DISPLAY DEVICE

(71) Applicant: Japan Display Inc., Tokyo (JP)

(72) Inventor: Hiroumi Kinjo, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/408,682

(22) Filed: Jan. 10, 2024

(65) Prior Publication Data

US 2024/0155877 A1 May 9, 2024

Related U.S. Application Data

(63) Continuation of application No. 17/521,045, filed on Nov. 8, 2021, now Pat. No. 11,910,655.

(30) Foreign Application Priority Data

Nov. 26, 2020 (JP) .................................. 2020-195811

(51) Int. Cl.
*H10K 59/122* (2023.01)
*H10K 50/814* (2023.01)
*H10K 59/123* (2023.01)

(52) U.S. Cl.
CPC ......... *H10K 59/122* (2023.02); *H10K 50/814* (2023.02); *H10K 59/123* (2023.02)

(58) Field of Classification Search
None
See application file for complete search history.

(56) References Cited

U.S. PATENT DOCUMENTS

| | | |
|---|---|---|
| 2007/0017084 A1 | 1/2007 | Kawamura et al. |
| 2007/0037069 A1 | 2/2007 | Ohnuma |
| 2009/0121983 A1 | 5/2009 | Sung et al. |
| 2014/0252321 A1 | 9/2014 | Pyon et al. |
| 2014/0312323 A1 | 10/2014 | Park et al. |
| 2020/0227509 A1* | 7/2020 | Yoon .................. H10K 59/38 |
| 2021/0257349 A1 | 8/2021 | Yang et al. |
| 2021/0280632 A1 | 9/2021 | Kim et al. |

FOREIGN PATENT DOCUMENTS

| | | |
|---|---|---|
| CN | 103427025 A | 12/2013 |
| JP | 2000-195677 A | 7/2000 |
| JP | 2005-259550 A | 9/2005 |
| JP | 2008-135325 A | 6/2008 |
| JP | 2014-154382 A | 8/2014 |
| JP | 2016-213380 A | 12/2016 |

OTHER PUBLICATIONS

Office Action issued on Apr. 11, 2024, in corresponding Chinese Application No. 202111324734.1, 18 pages.

* cited by examiner

*Primary Examiner* — Michelle Mandala
(74) *Attorney, Agent, or Firm* — Maier & Maier, PLLC

(57) ABSTRACT

According to one embodiment, a display device includes a base, a driving transistor placed on the base, a first insulating layer placed on the driving transistor, a cathode electrode placed on the first insulating layer, an organic layer including a light-emitting layer placed on the cathode electrode, an anode electrode that covers the organic layer, a second insulating layer placed on the first insulating layer and having an opening superposed on the cathode electrode, and a barrier wall placed on the second insulating layer. The anode electrode is electrically connected to the driving transistor through a first contact hole formed in the first insulating layer and the second insulating layer.

14 Claims, 18 Drawing Sheets

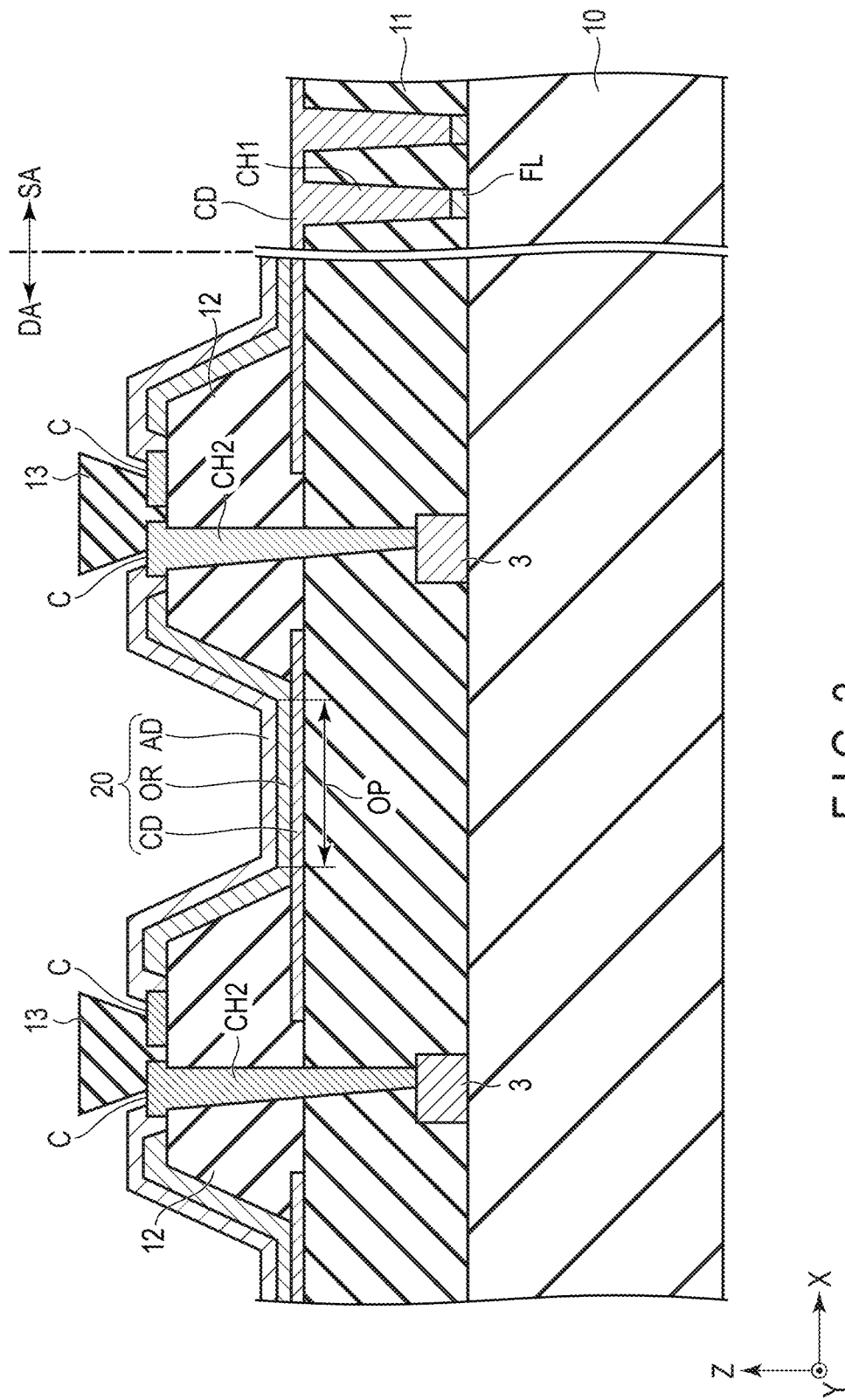
F I G. 3

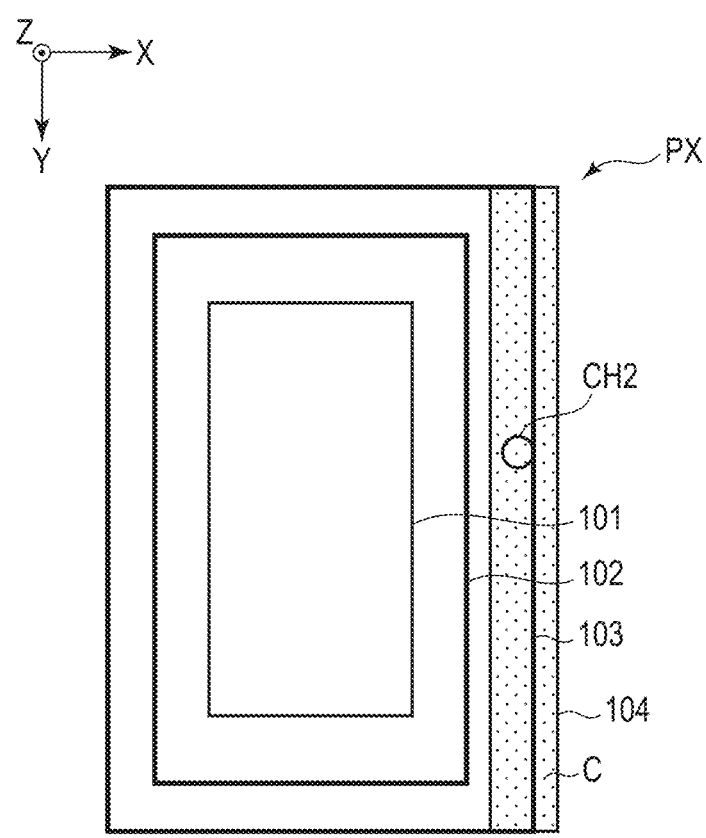
F I G. 10

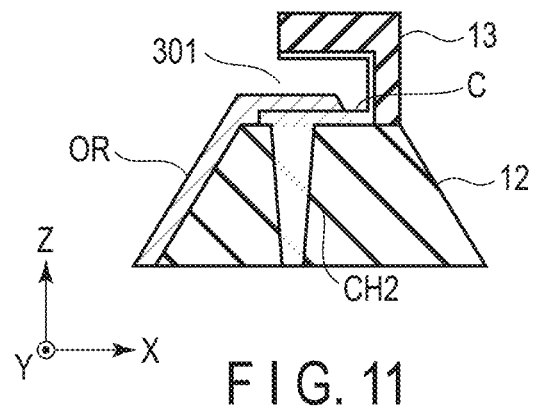
F I G. 11
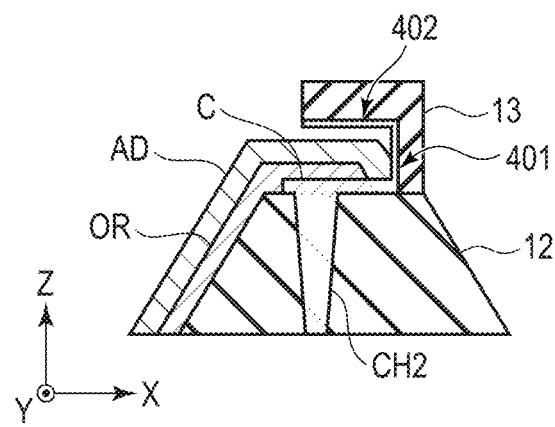
F I G. 12
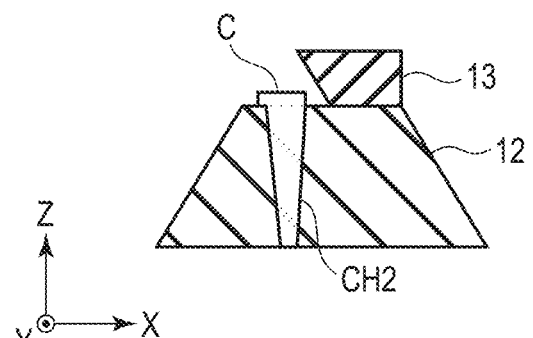
F I G. 13

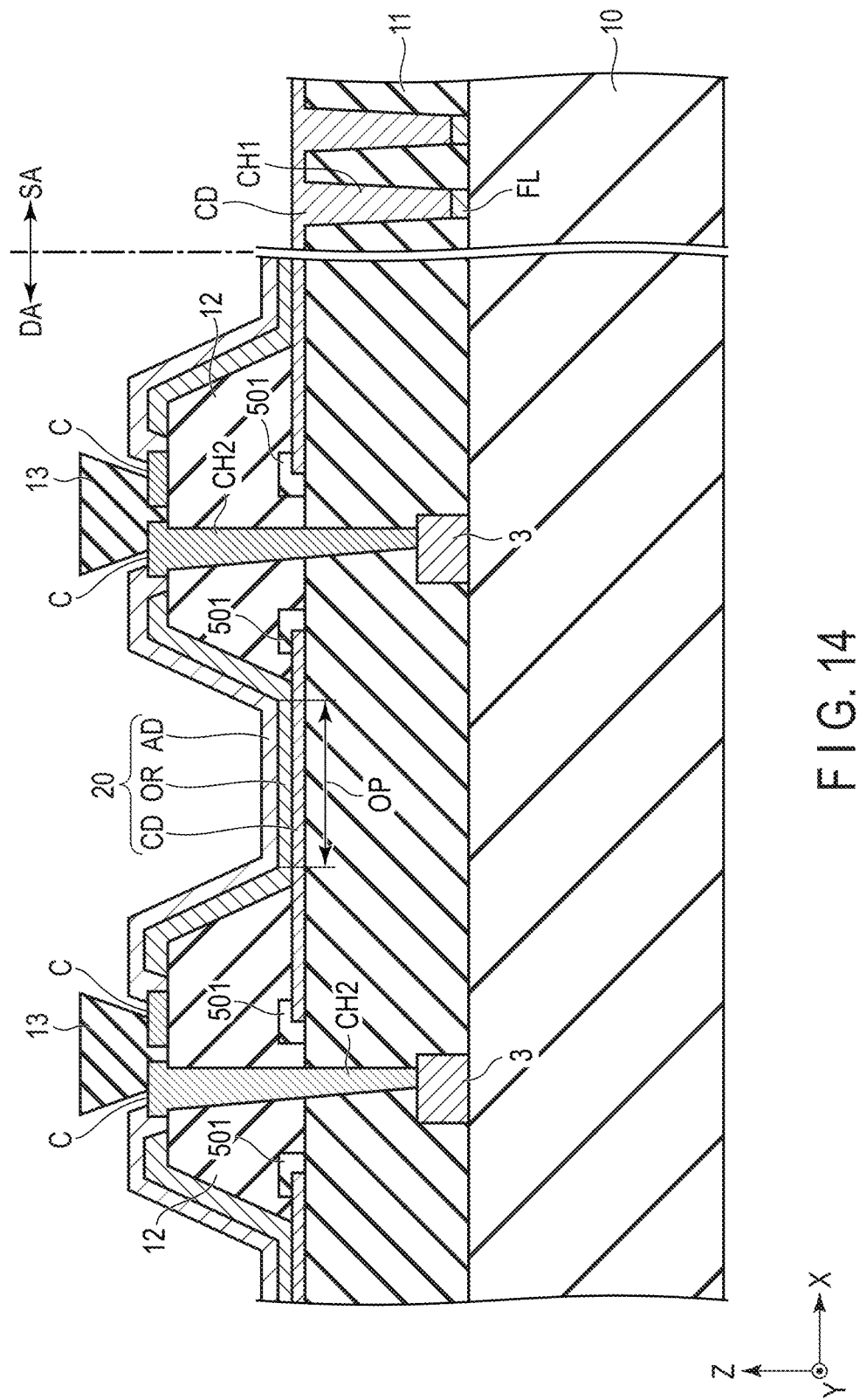
F I G. 14

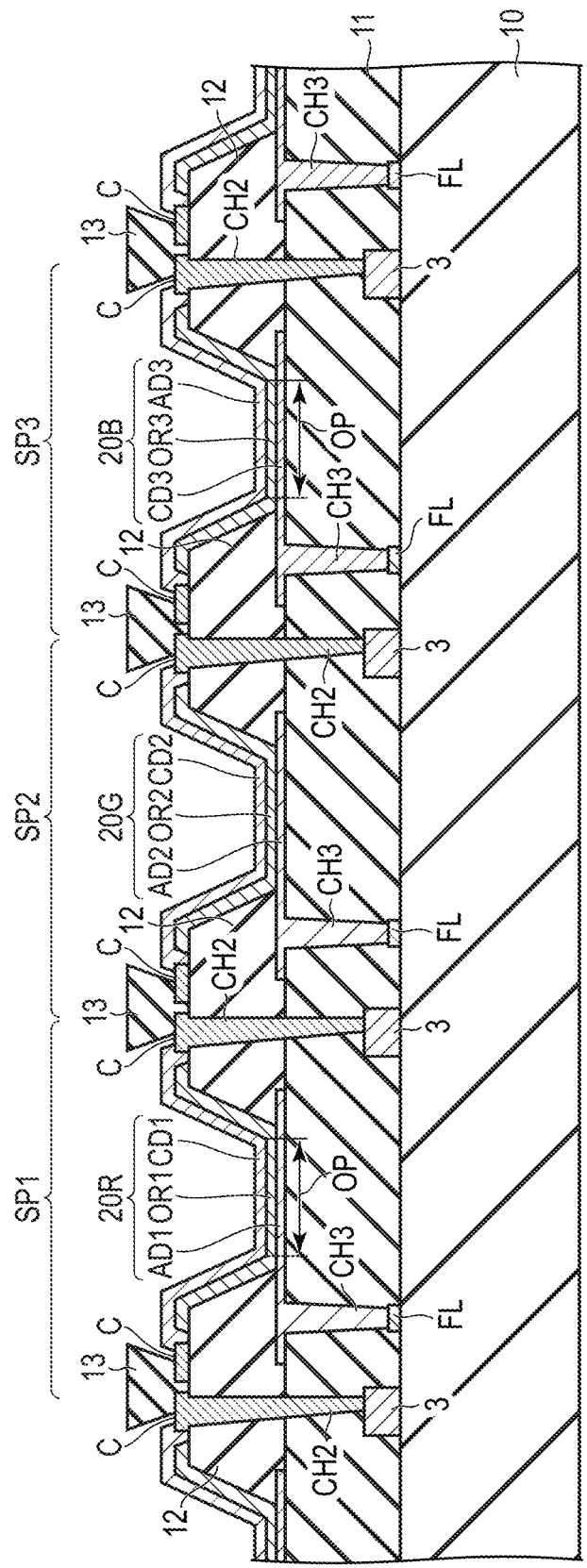
F I G. 23

DISPLAY DEVICE

CROSS-REFERENCE TO RELATED APPLICATIONS

This application is a Continuation of U.S. patent application Ser. No. 17/521,045, filed on Nov. 8, 2021, and which is based upon and claims the benefit of priority from Japanese Patent Application No. 2020-195811, filed Nov. 26, 2020, the entire contents of each of which are incorporated herein by reference.

FIELD

Embodiments described herein relate generally to a display device.

BACKGROUND

In recent years, a display device to which an organic light-emitting diode (OLED) is applied as a display element has been put to practical use. The display element includes an anode electrode (pixel electrode), a cathode electrode (common electrode) and an organic layer between the anode and cathode electrodes. The organic layer includes a function layer as well as a light-emitting layer.

The function layer includes, for example, an electron-injection layer, which is formed of an alkali metal such as lithium fluoride and calcium (or an alkali metal compound), and is easily deteriorated by moisture or the like. This deteriorate causes a dark spot and the like.

The display device is generally configured such that the anode electrode is disposed alongside an array substrate on which a driving transistor is formed and the cathode electrode is disposed alongside a substrate opposed to the array substrate. In this configuration, the electron-injection layer is easily affected by moisture or the like, and there is a concern that the display device may decrease in resistance to environment.

BRIEF DESCRIPTION OF THE DRAWINGS

FIG. 3 is an illustration of a configuration of a display element.

FIG. 10 is an illustration of a modification to the barrier wall.

FIG. 11 is an illustration of a modification to the barrier wall.

FIG. 12 is an illustration of a modification to the barrier wall.

FIG. 13 is an illustration of a modification to the barrier wall.

FIG. 14 is an illustration of a coating member that covers an end portion of the cathode electrode.

FIG. 23 is an illustration of an example of a configuration in which a cathode electrode and an anode electrode are replaced with each other.

DETAILED DESCRIPTION

Figure 1:
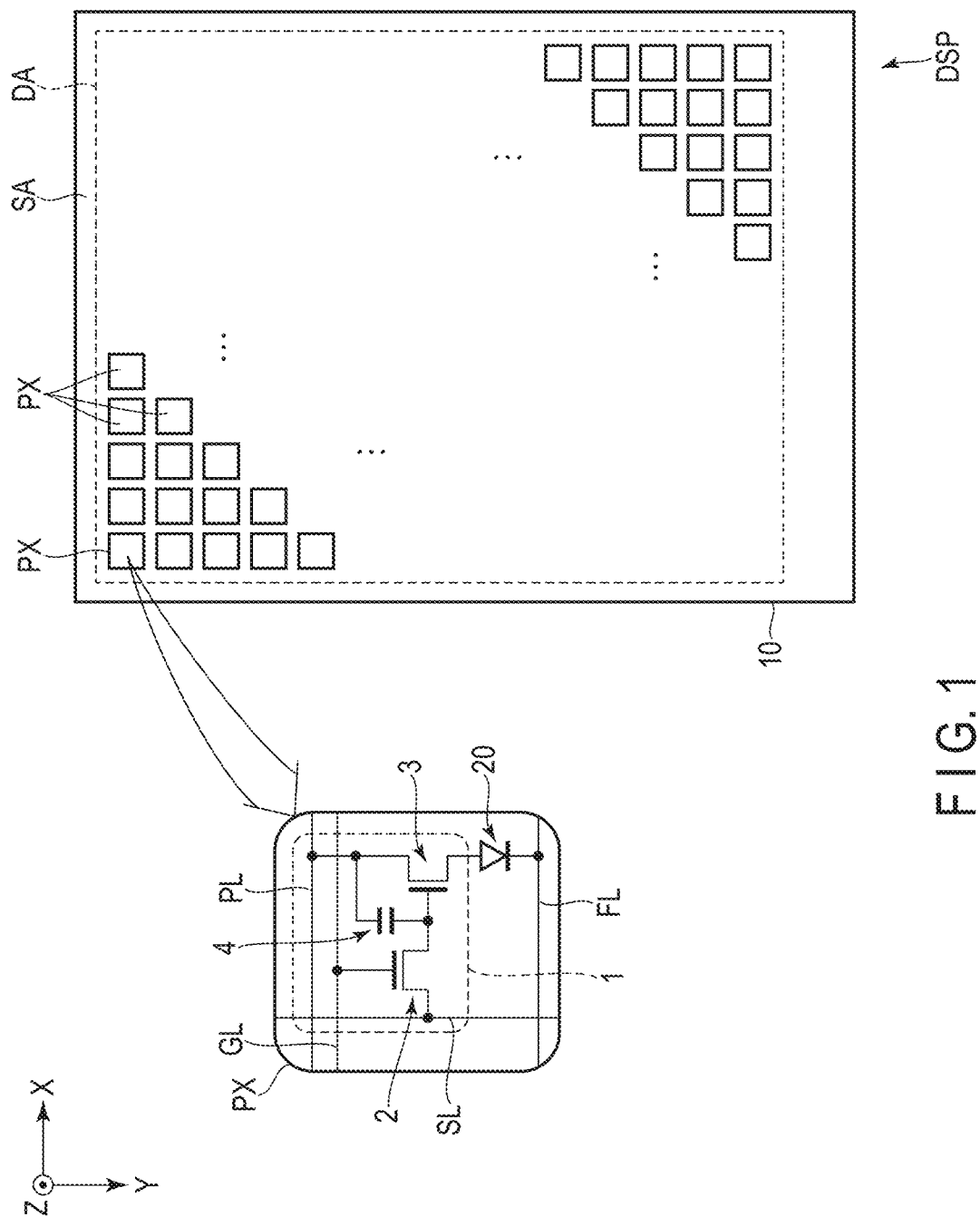
FIG. 1 is a diagram showing an example of a configuration of a display device according to a first embodiment.

In general, according to one embodiment, a display device includes a base, a driving transistor placed on the base, a first insulating layer placed on the driving transistor, a cathode electrode placed on the first insulating layer, an organic layer including a light-emitting layer placed on the cathode electrode, an anode electrode that covers the organic layer, a second insulating layer placed on the first insulating layer and having an opening superposed on the cathode electrode, and a barrier wall placed on the second insulating layer. The anode electrode is electrically connected to the driving transistor through a first contact hole formed in the first insulating layer and the second insulating layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

For easy understanding, X, Y and Z axes, which are orthogonal to each other, are shown in the drawings when necessary. The direction along the X axis, the direction along the Y axis and the direction along the Z axis will be referred to as a first direction X, a second direction Y and a third direction Z, respectively. The plane defined by the X and Y axes will be referred to as an X-Y plane and the plane defined by the X and Z axes will be referred to as an X-Z plane. Viewing the X-Y plane is called a planar view. In the present embodiments, the third direction Z is defined as "upward" and a direction opposite to the third direction Z is defined as "downward". With such phrases "a second member above or on a first member" and "a second member below or on a first member", the first and second members may be in contact with or separated from each other.

The display device DSP according to each of the following first and second embodiments is an organic electroluminescent display device including an organic light-emitting diode (OLED) as a display element, which is mounted on a television set, a personal computer, a mobile terminal, a mobile phone, etc.

First Embodiment

First, a first embodiment will be described. FIG. 1 is a diagram showing an example of a configuration of the display device DSP according to the first embodiment. The display device DSP includes an insulating array substrate (base) 10, a display area DA that displays an image and a surrounding area SA outside the display area DA. The areas DA and SA are provided on the array substrate 10. The array substrate 10 may be glass or a flexible resin film.

The display area DA includes a plurality of pixels PX arranged in a matrix in first and second directions X and Y.

Here is a brief description of a configuration example of one pixel PX. The pixel PX includes a pixel circuit 1 and a display element 20. The pixel circuit 1 includes a pixel switch 2, a driving transistor 3 and a capacitor 4. The pixel switch 2 and driving transistor 3 are, for example, switching elements configured by thin film transistors (TFTs).

In the pixel switch 2, the gate electrode is connected to a scanning line GL, the source electrode is connected to a signal line SL, and the drain electrode is connected to one of the electrodes of the capacitor 4 and the gate electrode of the driving transistor 3. In the driving transistor 3, the source electrode is connected to the other electrode of the capacitor 4 and a power supply line PL, and the drain electrode is connected to the anode electrode of the display element 20. The cathode electrode of the display element 20 is connected to a feeding line FL. Note that the configuration of the pixel circuit 1 is not limited to the example shown.

The display element 20 is an organic light-emitting diode (OLED) that is a light-emitting element. In the first embodiment, each of the pixels PX includes a display element 20 that emits light corresponding to the same wavelength, for example and, in this case, the display element 20 is configured to emit white light, for example. The configuration of the display element 20 will be described later.

According to the display device DSP described above, the pixel circuit 1 (driving transistor 3) drives the pixel PX (display element 20) to display an image in the display area DA.

The outline of the display device DSP according to the first embodiment will be described with reference to FIG. 2. The display device DSP according to the first embodiment is an organic electroluminescent display device as described above. In this display device DSP, a driving current is caused to flow through an organic layer formed between an anode electrode (anode) and a cathode electrode (cathode) to cause a light-emitting layer included in the organic layer to emit light. The anode electrode, cathode electrode and organic layer constitute the display element 20 described above. The organic layer includes a function layer such as an electron-injection layer, an electron-transport layer and a hole-transport layer as well as the light-emitting layer as shown in FIG. 2, but it may include another function layer.

Figure 2:
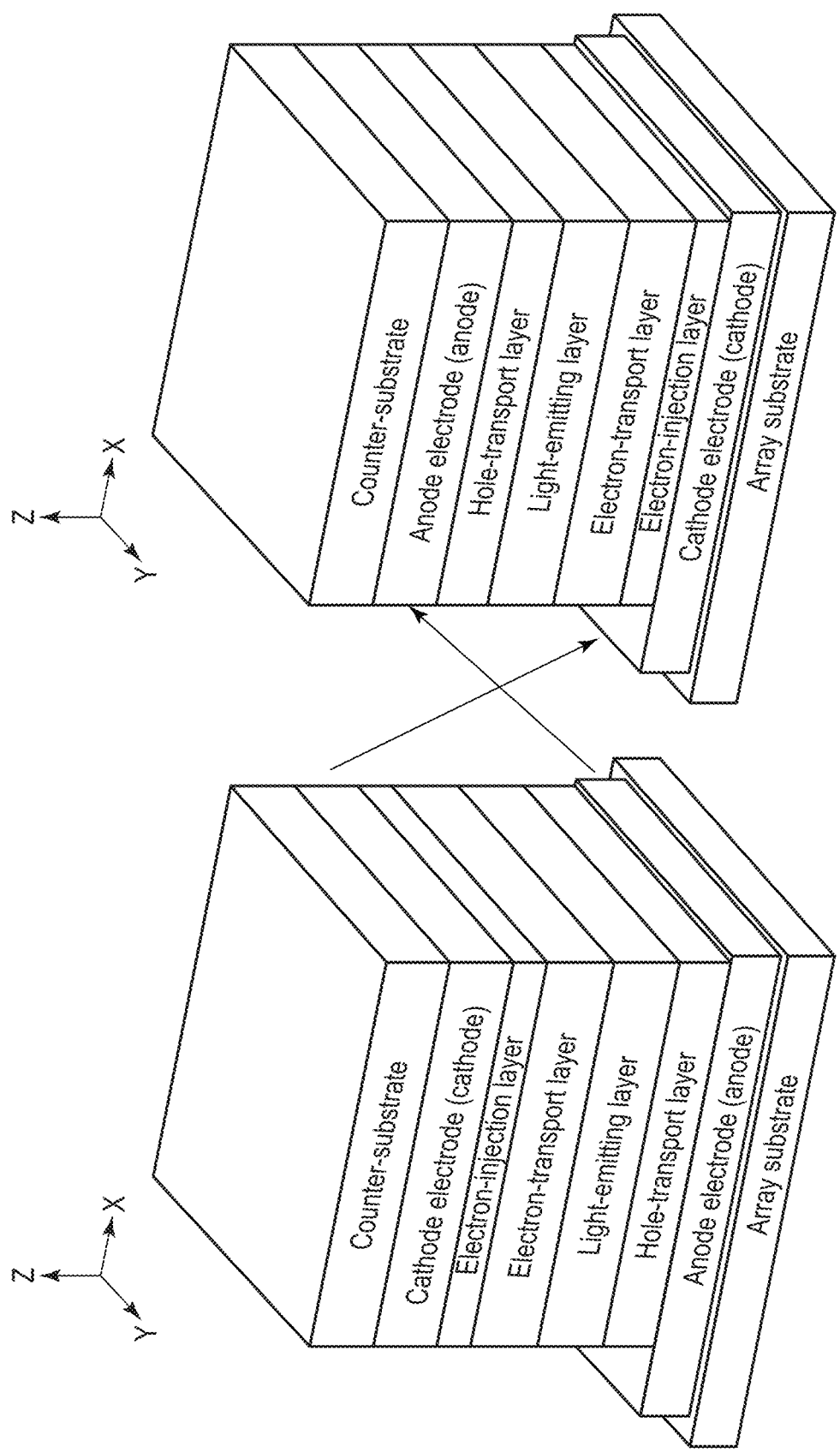
FIG. 2 is a schematic view illustrating the display device.

FIG. 2 shows on the left side the positional relationship among the anode electrode, cathode electrode and organic layer of a general organic electroluminescent display device. As shown on the left side of FIG. 2, in the general organic electroluminescent display device, the anode electrode, organic layer and cathode electrode are arranged in sequence on the array substrate. A counter-substrate is opposed to the array substrate with the anode electrode, organic layer and cathode electrode therebetween. The counter-substrate has optical transparency. The light emitted from the display element 20 by the light-emitting layer is visually recognized through the counter-substrate.

For example, an alkali metal that is easily deteriorated by moisture and the like is used in the electron-injection layer included in the organic layer. In a general organic electroluminescent display device, the electron-injection layer is formed on the cathode electrode side. In general, a material for forming an electron-transport layer (electron transport-ability material) which is in contact with the electron-injection layer is highly active. If, therefore, the anode electrode is disposed on the array substrate side and the cathode electrode is disposed on the counter-substrate side as shown on the left side of FIG. 2, the electron-injection layer formed on the cathode electrode side is easily affected by moisture and the like to decrease in its environmental resistance.

The display device DSP (organic electroluminescent display device) according to the first embodiment is therefore configured such that the cathode electrode is disposed on the array substrate side and the anode electrode is disposed on the counter-substrate side, as shown on the right side of FIG. 2.

The first embodiment is described for convenience as including a counter-substrate. The counter-substrate may be excluded or replaced by a polarizer or the like.

The configuration of the display element 20 in the first embodiment will be described below with reference to FIG. 3. In the display device DSP, the pixel circuit 1 is placed on the array substrate 10, but FIG. 3 shows only the driving transistor 3 of the pixel circuit 1 in a simplified manner.

An insulating layer 11 is formed on the array substrate 10 to cover the driving transistor 3. The insulating layer 11 corresponds to the underlayer of the display element 20 and is, for example, an organic insulating layer.

An insulating layer 12 is formed on the insulating layer 11. The insulating layer 12 is, for example, an organic insulating layer. The insulating layer 12 is formed to partition the display element 20 or the pixel PX including the display element 20, and may be referred to as a rib, for example.

The display element 20 includes a cathode electrode CD, an organic layer OR and an anode electrode AD. In the first embodiment, as described above, the cathode electrode CD is disposed alongside the array substrate 10, and the anode electrode AD is disposed alongside the counter-substrate (not shown).

The cathode electrode CD is an electrode common to the display elements 20 or the pixels PX including their respective display elements 20, and may be referred to with a common electrode, for example. The anode electrode AD is an electrode disposed for each of the display elements 20 or for each of the pixels PX, and may be referred to as a pixel electrode, for example.

The cathode electrode CD is placed on the insulating layer 11 and partly covered with the insulating layer 12. The cathode electrode CD is electrically connected to, for example, to the feeding line FL placed in the surrounding area SA outside the display area DA. In this case, as shown in FIG. 3, the cathode electrode CD is connected to the feeding line FL through a contact hole CH1 formed in the insulating layer 11 superposed on the surrounding area SA. The feeding line FL is a line (auxiliary line) for applying a common voltage to the cathode electrode CD.

The cathode electrode CD is a transparent electrode formed of a transparent conductive material such as indium tin oxide (ITO) and indium zinc oxide (IZO). The cathode electrode CD may be a metal electrode formed of a metal material such as silver and aluminum. The cathode electrode CD may be a stacked-layer body of transparent electrodes and metal electrodes. The cathode electrode CD may be formed as, for example, a stacked-layer body in which a transparent electrode, a metal electrode and a transparent electrode are stacked in the order presented, or may be formed as a stacked-layer body of three or more layers.

The insulating layer 12 has an opening OP superposed on the cathode electrode CD in each of the pixels PX. The organic layer OR is placed on the insulating layer 12 and is in contact with the cathode electrode CD through the opening OP. Although not shown in FIG. 3, the organic layer OR includes a light-emitting layer and a function layer as described above.

The anode electrode AD is formed to cover the organic layer OR. The anode electrode AD is a transparent electrode formed of a transparent conductive material such as ITO and IZO. The anode electrode AD may be formed not only of a transparent conductive material, but also of metal thinned so as to transmit light or by stacking the metal and the transparent conductive material one on another. In addition, the anode electrode AD may be covered with a transparent protective film (including at least one of inorganic and organic insulating films).

In the first embodiment, the anode electrode AD placed on the counter-substrate side is electrically connected to the driving transistor 3 so as to drive the display device DSP by the design of the array substrate 10 (TFT array) which is similar to that of a general organic electroluminescent display device.

Specifically, a contact hole CH2 is formed through the insulating layers 11 and 12 to expose the driving transistor 3, and a connection electrode C is placed on the contact hole CH2. The connection electrode C is formed on the insulating layer 12 along the outer periphery of the pixel PX from the contact hole CH2, and is in contact with an end portion of the anode electrode AD. This configuration makes it possible to connect the anode electrode AD to the driving transistor 3 through the connection electrode C and the contact hole CH2. The contact hole CH2 may be formed through each of the insulating layers 11 and 12 or may be formed through the insulating layers 11 and 12 in one step.

In the first embodiment, it is preferable that the organic layer OR is not in contact with (not connected to) the connection electrode C, though the anode electrode AD is in contact with (connected to) the connection electrode C.

In the example shown in FIG. 3, the anode electrode AD is connected to the driving transistor 3 through the connection electrode C and the contact hole CH2. However, the connection electrode C may be excluded if the anode electrode AD can be connected to the driving transistor 3 through the contact hole CH2.

In the first embodiment, a barrier wall 13 is placed at a position corresponding to the boundary between the pixels PX on the connection electrode C (or the insulating layer 12). The barrier wall 13 has an inverse tapered shape. The inverse tapered shape means that the width of the upper portion of the barrier wall 13 is larger than that of the lower portion (bottom portion) thereof, as shown in FIG. 3. The side surface of the barrier wall 13 may be a plane inclined with respect to the third direction Z or may be a curved surface. The barrier wall 13 may be formed of a plurality of portions which gradually decreases from the top toward the bottom.

The barrier wall 13 is formed to overlap the insulating layer 12 in planar view and partition the pixels PX. The organic layer OR is formed by, for example, an anisotropic or directional vacuum evaporation method. When organic materials for forming the organic layer OR are evaporated, for example, all over the display area DA with the barrier wall 13 placed, the organic layer OR is hardly formed on the side surface of the barrier wall 13 because the barrier wall 13 has an inverse tapered shape. Thus, an organic layer OR that is divided by the barrier wall 13 for each pixel PX can be formed.

The anode electrode AD is formed by a vacuum evaporation method having a smaller directivity or a higher isotropy than the vacuum evaporation of the organic layer OR. In this case, the anode electrode AD covers the side surface and top surface of the barrier wall 13 and the insulating layer 12 located under the side surface of the inverse-tapered barrier wall 13, and is connected to the connection electrode C. Although not shown in FIG. 3, when the organic layer OR and the anode electrode AD are formed as described above, the top surface of the barrier wall 13 is covered with the organic layer OR and the anode electrode AD.

Although not shown in FIG. 3, a counter-substrate (insulating substrate) is bonded onto the anode electrode AD, the barrier wall 13 and the like by, for example, an adhesive.

Figure 4:
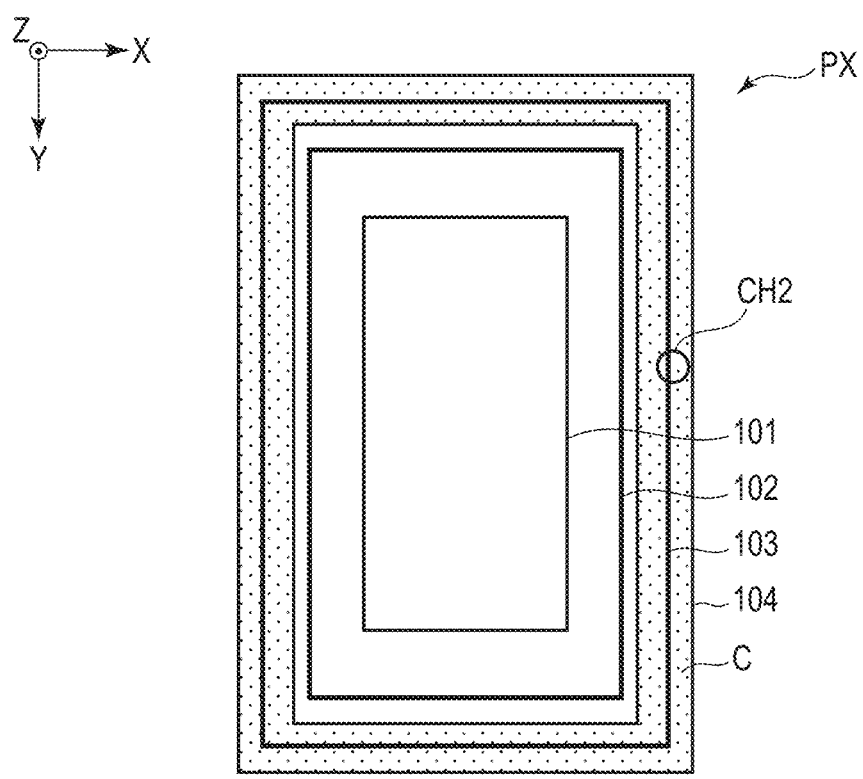
FIG. 4 is a schematic plan view of a pixel.

FIG. 4 is a schematic plan view of the pixel PX. The positional relationship in planar view among the opening OP, organic layer OR, anode electrode AD and connection electrode C will be mainly described.

In FIG. 4, a frame 101 represents an end portion of the opening OP (a pixel opening), a frame 102 represents an end portion of the organic layer OR (organic evaporated film end), and a frame 103 represents an end portion of the anode electrode AD (anode end).

In the first embodiment, the connection electrode C (contact line) is disposed to surround the opening OP and the organic layer OR (along the outer periphery of the pixel PX), and overlaps the anode electrode AD and the contact hole CH2. Thus, the anode electrode AD is electrically connected to the driving transistor 3 placed on the array substrate 10 through the connection electrode C and the contact hole CH2.

In FIG. 4, the connection electrode C is shown to be placed along the outer periphery of the pixel PX. If, however, the pixel PX is partitioned into rectangles, the connection electrode C may be formed along at least one side of the pixel PX.

Furthermore, in FIG. 4, the contact hole CH2 is shown to be formed in the vicinity of the middle of one side of the pixel PX. If, however, the contact hole CH2 is formed for each of the pixels PX, it may be formed, for example, at a corner of the pixel PX.

Figure 5:
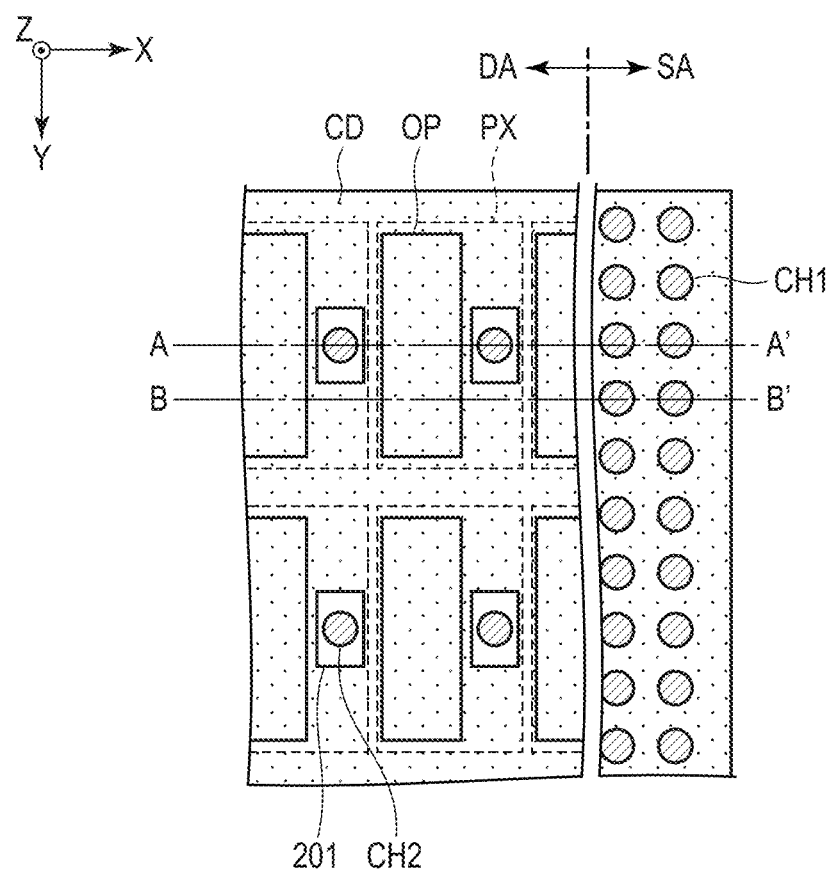
FIG. 5 is an illustration of a cathode electrode.

The cathode electrode CD will be described with reference to FIG. 5. FIG. 5 shows the cathode electrode CD in planar view.

Since the cathode electrode CD is an electrode common to the pixels PX (display elements 20) arranged in the display area DA as described above, it is formed uniformly all over the pixels PX. Since, however, the cathode electrode CD is placed alongside the array substrate 10 in the first embodiment, it is provided with an opening 201 for connecting the anode electrode AD to the driving transistor 3 as shown in FIG. 5. The opening 201 is formed for each of the pixels PX, and the contact hole CH2 is formed through the opening 201.

The cathode electrode CD is also formed to be superposed on the surrounding area SA and is connected to the feeding line FL through a plurality of contact holes CH1 formed in the insulating layer 11 superposed on the surrounding area SA.

In FIG. 5, the cathode electrode CD is shown to be connected to the feeding line FL through the contact holes CH1. The number or positions of the contact holes CH1 may be changed as appropriate.

Figure 6:
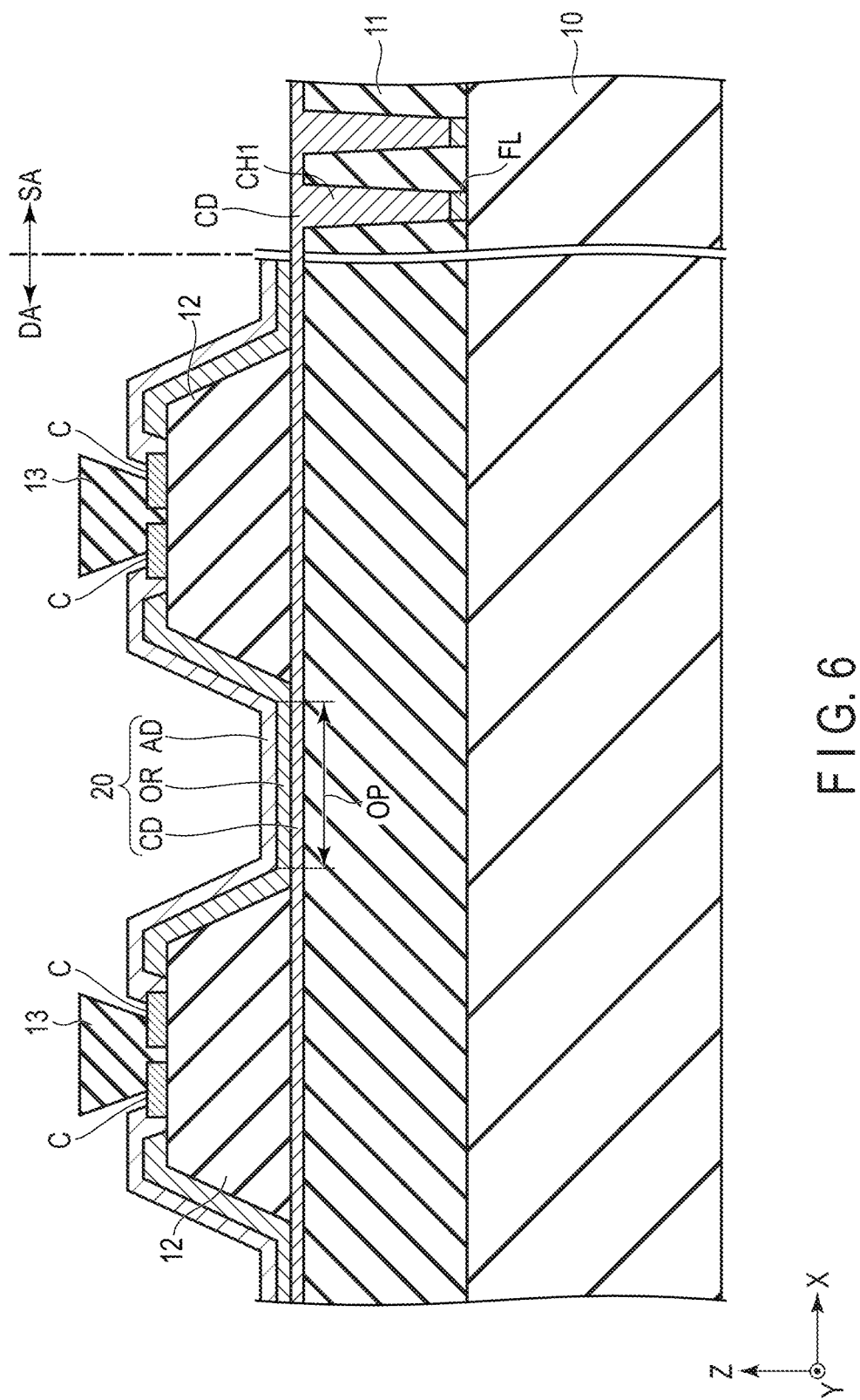
FIG. 6 is a sectional view of the cathode electrode, which does not show an opening formed in the cathode electrode.

FIG. 3 shows a section along line A-A' in FIG. 5 (the section including the opening 201 formed in the cathode electrode CD). Although not described in detail, for example, in the section along line B-B' shown in FIG. 5 (the section not including the opening 201 formed in the cathode electrode CD), the contact hole CH2 is not formed as shown in FIG. 6.

In FIG. 5, the opening 201 formed in the cathode electrode CD is shown to have a rectangular shape. The shape of the opening 201 is not limited but may be, for example, a circle. The size of the opening 201 is not limited, either if the cathode electrode CD is placed to be superposed on the opening OP of the insulating layer 12 and the contact hole CH2 can be formed. When, for example, a base material having light transmittance such as transparent polyimide is used for the array substrate 10, the opening 201 is increased in size to improve the transmittance of the entire display device DSP (to make the display device transparent). In this case, the transmittance may be improved further, for example, by meshing the cathode electrode CD (by forming the cathode electrode CD by mesh wire or the like).

As described above, in the first embodiment, the cathode electrode CD is placed on the insulating layer 11 on the array substrate 10 (base), and the anode electrode AD is formed to cover the organic layer OR placed on the cathode electrode CD and is electrically connected to the driving transistor 3 that drives the pixels PX through the contact holes CH2 (first contact holes) provided in the (first and second) insulating layers 11 and 12.

When the anode electrode AD is placed alongside the array substrate 10 and the cathode electrode CD is placed alongside the counter-substrate as in a general organic electroluminescent display device, resistance to environment is lowered, whereas when the cathode electrode CD is simply placed alongside the array substrate 10 and the anode electrode AD is placed alongside the counter-substrate, the direction of current flowing through the organic layer OR needs to be reversed. Thus, there is a concern that the design of the TFT array (array substrate 10) must be changed drastically, resulting in a large cost.

In the first embodiment, the anode electrode AD placed alongside the counter-substrate is connected to the driving transistor 3 through the contact hole CH2. Even though the direction of current flowing through the organic layer OR is reversed, each of the pixels PX (display elements 20) can be driven by the design of a TFT array applied to a general organic electroluminescent display device.

In the first embodiment, the barrier wall 13 is placed on the insulating layer 12 (or the connection electrode C) and at the boundary between adjacent two pixels PX (first and second pixels). With this configuration, the display element 20 (organic layer OR and anode electrode AD) provided in each of the pixels PX can be divided (partitioned) appropriately without using a fine mask or the like, for example, by evaporating an appropriate material for forming the organic layer OR and the anode electrode AD all over the pixels PX.

In the first embodiment, the connection electrode C is placed along the outer periphery of the pixel PX and the anode electrode AD is connected to (is in contact with) the connection electrode C. With this configuration, the connection resistance can be lowered. In addition, the anode electrode AD is in contact with the connection electrode C and the organic layer OR is not in contact with the connection electrode C (contactless). With this configuration, the area of contact between the anode electrode AD and the connection electrode C can be secured, and a leak current can be inhibited from being generated through the organic layer OR.

In the first embodiment, the cathode electrode CD and the feeding line FL are connected to each other through the contact hole CH1 (second contact hole) formed in the insulating layer 11 superposed on the surrounding area SA. With this configuration, a common voltage can appropriately be applied to the cathode electrode CD.

Modifications to the first embodiment will be described below. First, modifications to the barrier wall 13 used in the first embodiment will be described with reference to FIGS. 7 to 13. Note that FIGS. 7 to 9 and 13 show only the insulating layer 12, barrier wall 13, connection electrode C and contact hole CH2.

Figure 7:
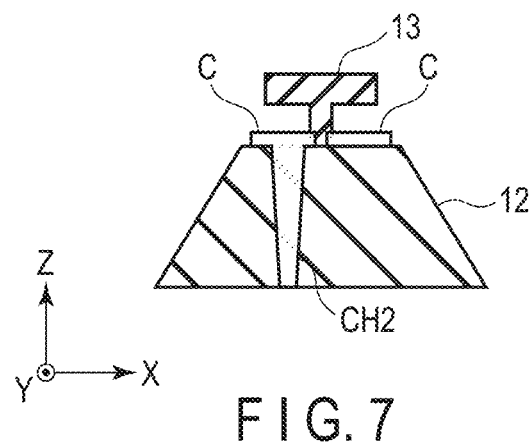
FIG. 7 is an illustration of a modification to a barrier wall.

In the first embodiment, the barrier wall 13 has an inverse-tapered shape as shown in FIG. 3, but the barrier wall 13 may have, for example, a T shape as shown in FIG. 7. The width of the upper portion of the barrier wall 13 is larger than that of the lower portion thereof as in the inverse-tapered shape, with the result that the pixel PX (the organic layer OR and the anode electrode AD) can be divided appropriately.

If the barrier wall 13 that is symmetrical (bilaterally symmetrical) with regard to the third direction Z (the normal direction of the main surface of the array substrate 10) is used, the stability of the barrier wall 13 can be improved.

Figure 8:
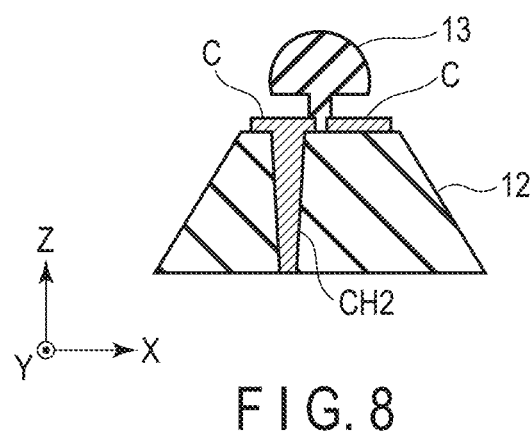
FIG. 8 is an illustration of a modification to the barrier wall.

As the barrier wall 13 having a bilaterally symmetrical shape, a barrier wall 13 having a shape as shown in FIG. 8 may be used.

Figure 9:
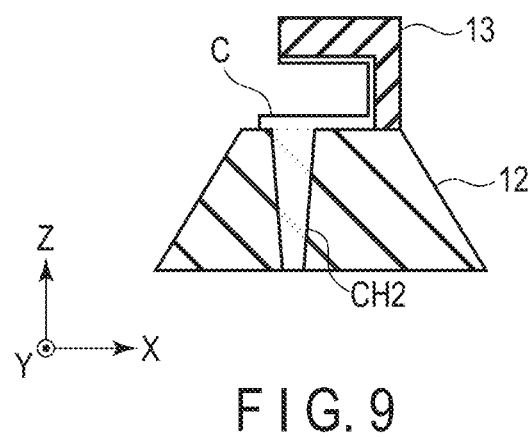
FIG. 9 is an illustration of a modification to the barrier wall.

For example, a barrier wall 13 having an inverted-L shape as shown in FIG. 9 can be used. If a barrier wall 13 that is asymmetrical (bilaterally asymmetrical) with regard to the third direction Z (the normal direction of the main surface of the array substrate 10) is used, the area of the connection electrode C formed on the insulating layer 12 in planar view can be increased by disposing the barrier wall 13 on the top surface of the insulating layer 12 and toward the end portion thereof in the first direction X, for example.

FIG. 10 is a schematic plan view of the pixel PX when the barrier wall 13 shown in FIG. 9 is used. In this case, the connection electrode C cannot be formed along the outer periphery of the pixel PX as shown in FIG. 4, but the area of contact between the connection electrode C and the anode electrode AD can be increased and thus the connection resistance can be lowered.

When an organic material is evaporated using, for example, the barrier wall 13 shown in FIG. 9, it may go around the barrier wall 13 and enter a space 301 formed by the top surface of the insulating layer 12 and the barrier wall 13 to form the organic layer OR that covers the connection electrode C placed on the insulating layer 12 as shown in FIG. 11.

In the above case, since the connection electrodes C is formed on the surfaces (side surface 401 and bottom surface 402) of the barrier wall 13 that is in contact with the space 301 as shown in, for example, FIG. 12, even if the connection electrodes C placed on the top surface of the insulating layer 12 is covered with the organic layer OR, the anode electrodes AD is in contact with the connection electrodes C formed on the side surface 401 of the barrier wall 13 or the like, with the result that the pixel PX (display element 20) can be driven. In addition, when the anode electrode AD is formed so as to be in contact with the connection electrode C formed on the bottom surface 402 of the barrier wall 13, the area of contact between the anode electrode AD and the connection electrode C can be increased.

As the barrier wall 13 having a bilaterally asymmetrical shape, a barrier wall 13 having a shape (trapezoidal shape) as shown in FIG. 13 can be used.

Next is a description of a modification to the cathode electrode CD used in the first embodiment. First, in the first embodiment, an opening 201 is formed in the cathode electrode CD for each of the pixels PX and a contact hole CH2 is formed through the opening 201, as has been described with reference to FIG. 5. In this case, an electrochemical reaction is accelerated, which may cause the cathode electrode CD to be corroded or eluted.

Figure 15:
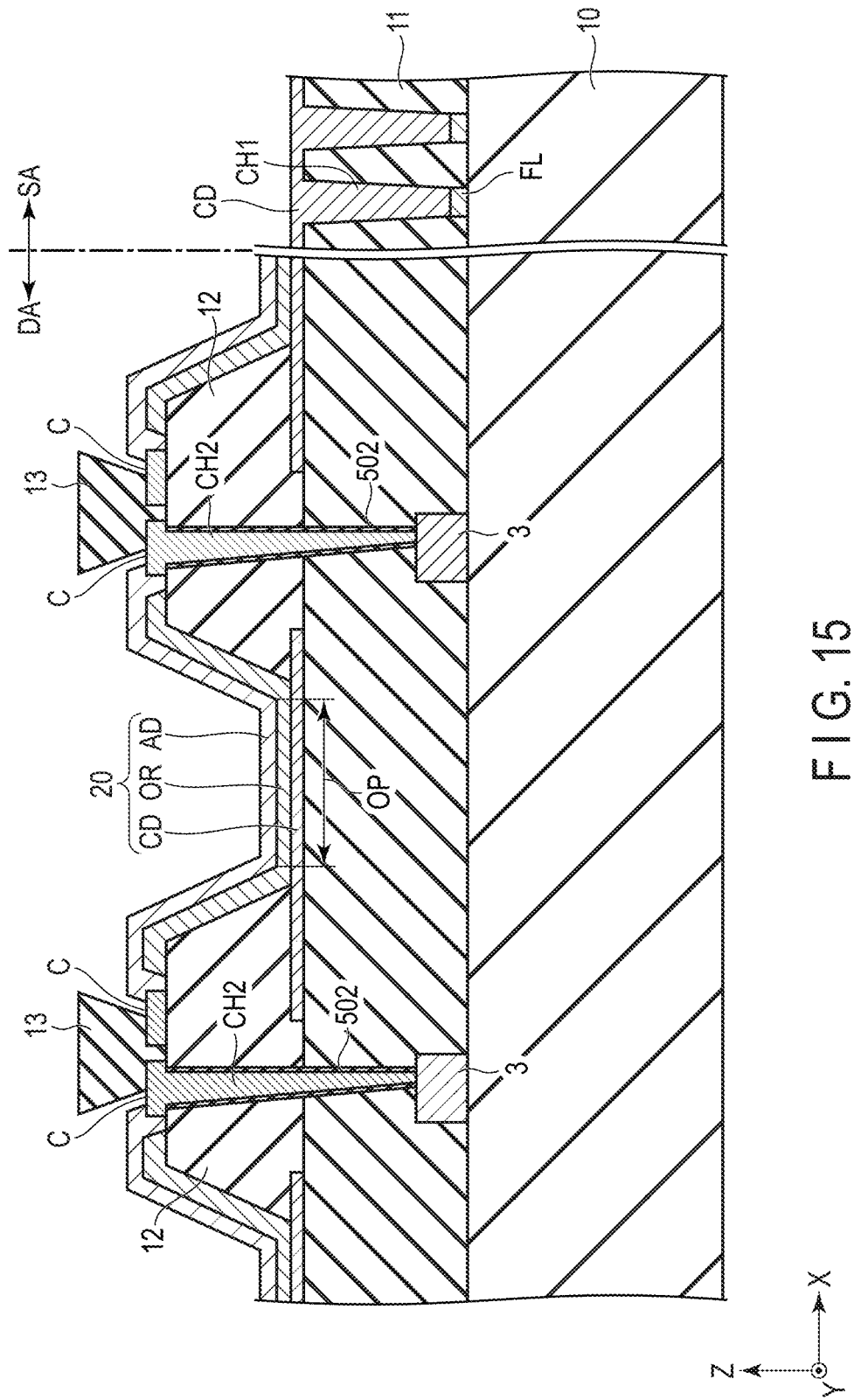
FIG. 15 is a view for explaining a coating member that covers a contact hole.

In the first embodiment, therefore, an end portion (edge) of the cathode electrode CD to form the opening 201 may be coated with a coating member 501 (in other words, the end portion of the cathode electrode CD is covered with the coating member 501). In this case, the coating member 501 has only to be formed to cover the end portion of the cathode electrode CD facing the contact hole CH2. Furthermore, as shown in FIG. 15, for example, the contact hole CH2 may be covered with the coating member 502 (in other words, the inner surface of the contact hole CH2 is covered with the coating member 502).

In the above case, the coating members 501 and 502 may be formed of the same material as the insulating layer 11 (or the insulating layer 12). Assume here that they are formed of a material having high insulating properties and high coating properties, such as silicon oxide (SiO), silicon nitride (SiN) and an insulating polymer. Note that both the coating members 501 and 502 may be formed.

With the above configuration, metal ions eluted from, for example, the cathode electrode CD permeate through the interface between the insulating layer 11 (planarization layer) and the insulating layer 12 (rib) to prevent the cathode electrode CD and the anode electrode AD from being connected (short-circuited).

Figure 16:
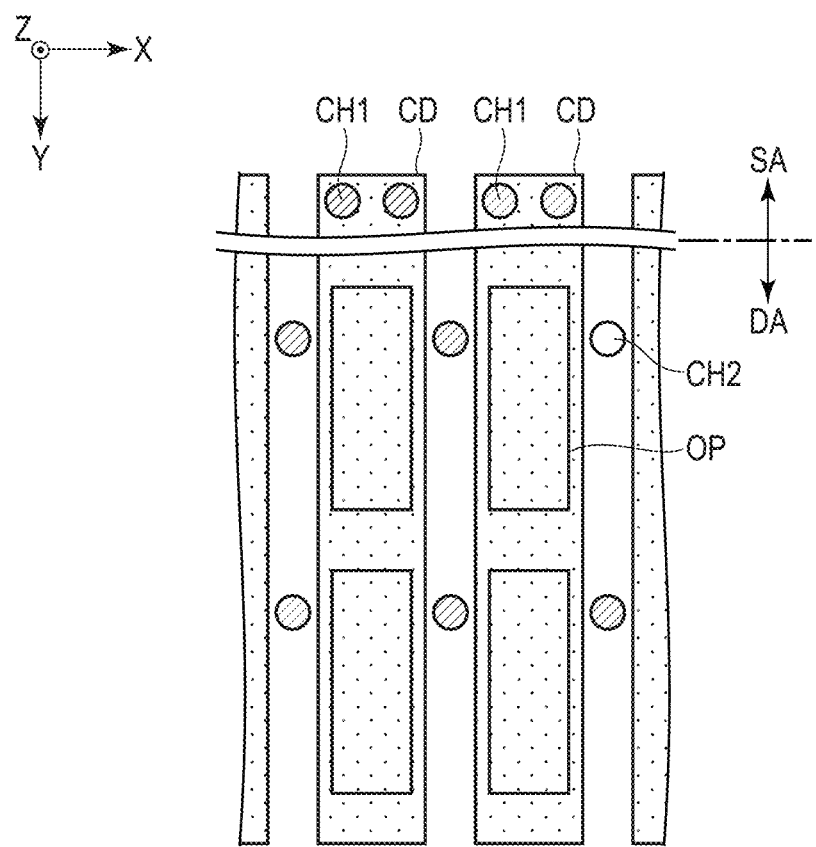
FIG. 16 is a diagram showing cathode electrodes formed in stripes.

In the first embodiment, the cathode electrode CD is formed all over the pixels PX arranged in the display area DA. However, the cathode electrode CD may be divided into stripes as shown in, for example, FIG. 16. In this case, a contact hole CH1 has only to be formed for each of the stripes obtained by dividing the cathode electrode CD to connect the cathode electrode CD to the feeding line FL.

Not only the cathode electrode CD is divided into stripes, but also it may be divided, for example, for each pixel PX or for each set of adjacent pixels PX.

Figure 17:
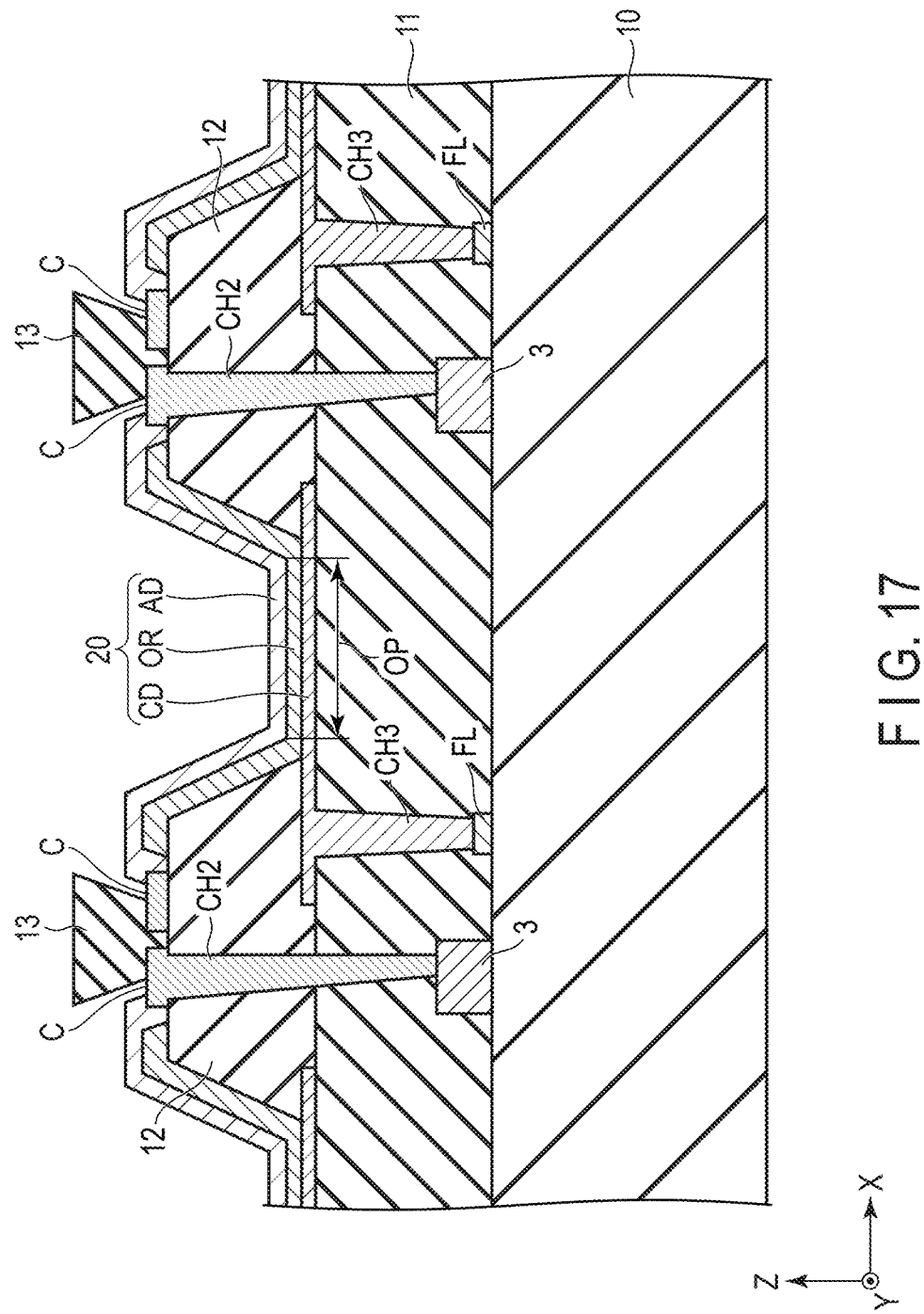
FIG. 17 is an illustration of contact holes formed in an insulating layer superposed on a display area.

Furthermore, when the cathode electrode CD is divided as described above, it may be connected to the feeding line FL through the contact hole CH3 (third contact hole) formed in the insulating layer 11 superposed on the display area DA where the pixels PX are arranged, as shown in FIG. 17. In this configuration, the contact hole CH1 need not be formed in the surrounding area SA as shown in FIG. 3. Thus, the surrounding area SA can be reduced to narrow the frame.

In the first embodiment, a common voltage is applied to the cathode electrode CD through the feeding line FL. When the cathode electrode CD is divided into cathode electrodes CD as described above, different voltages can be applied to their respective cathode electrodes CD (pixels PX).

In addition, when the cathode electrode CD is divided, a cathode electrode CD can be placed alongside the array substrate 10 in, for example, a predetermined pixel PX (first pixel), and an anode electrode AD can be placed alongside the array substrate 10 in a pixel PX (second pixel) different from the first pixel PX.

Figure 18:
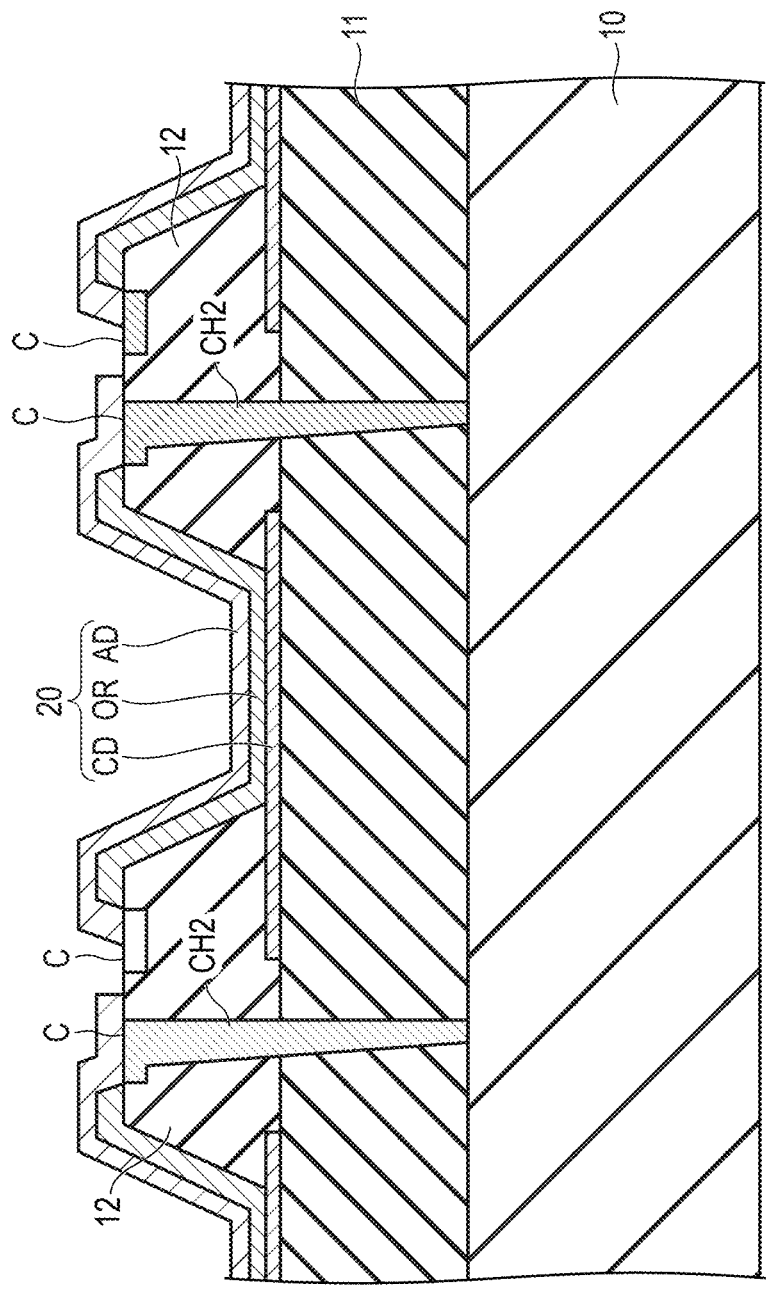
FIG. 18 is an illustration of an example of an organic layer and an anode electrode formed by another method.

In the first embodiment, the pixels PX (organic layer OR and anode electrode AD) are separated (partitioned) by the barrier wall 13 placed on the insulating layer 12. However, the organic layer OR and anode electrode AD may be formed by patterning using, for example, a fine mask, etching after a film is formed on the entire surface, and the like. In this configuration, the organic layer OR and the anode electrode AD can be formed as shown in FIG. 18, for example.

Figure 19:
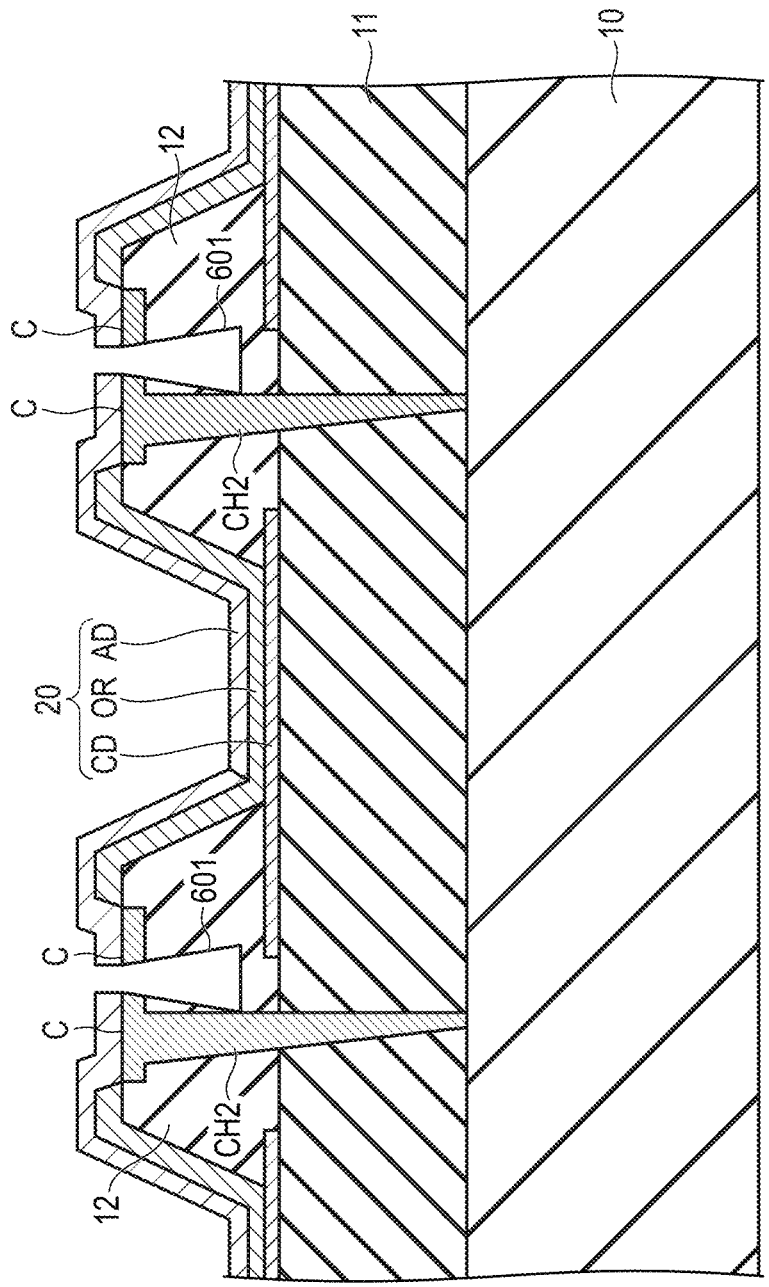
FIG. 19 is an illustration of an example of an organic layer and an anode electrode formed by still another method.

In addition, the organic layer OR and the anode electrode AD may be formed by providing a trench 601 in the insulating layer 12 as shown in FIG. 19, for example. The trench 601 is so shaped that the width of the lower portion (bottom portion) is larger than that of the upper portion. The side surface of the trench 601 is inclined with respect to the third direction Z, for example. According to the trench 601, when materials for forming the organic layer OR and the anode electrode AD are evaporated all over the pixels PX, the organic layer OR and the anode electrode AD (pixels PX) can be separated at the portion of the trench 601.

In the first embodiment, each of the pixels PX includes a display element 20 that emits light corresponding to the same wavelength. Assume that the display element 20 emits white light (the color of emitted light is white). In this case, for example, if the display device DSP is provided with color filters colored in red, green and blue at a position opposed to the display element 20 (a position in the direction of the counter-substrate), red, green and blue light can be emitted from the pixels PX, thereby enabling multicolor display.

When the display element 20 emits ultraviolet light (the color of emitted light is ultraviolet), a light conversion layer is formed opposite to the display element 20, thereby enabling multicolor display.

Second Embodiment

Next is a description of a second embodiment. In the description, the same components as those of the first embodiment will not be described in detail, but different components from those of the first embodiment will mainly be described.

The first embodiment has been described as includes a display element 20 in which each of the pixels PX emits light corresponding to the same wavelength (in other words, the pixels PX display the same color). The second embodiment differs from the first embodiment in that each of the pixels PX includes sub-pixels SP1, SP2 and SP3 which display different colors. In one example, a pixel PX includes a sub-pixel SP1 displaying red, a sub-pixel SP2 displaying green and a sub-pixel SP3 displaying blue. Note that the pixel PX may include four or more sub-pixels including sub-pixels of other colors such as white in addition to the above sub-pixels of the three colors.

When each of the pixels PX includes the sub-pixels SP1, SP2 and SP3 as described above, each of the sub-pixels SP1, SP2 and SP3 includes the pixel circuit 1 and the display element 20 described in the first embodiment.

Figure 20:
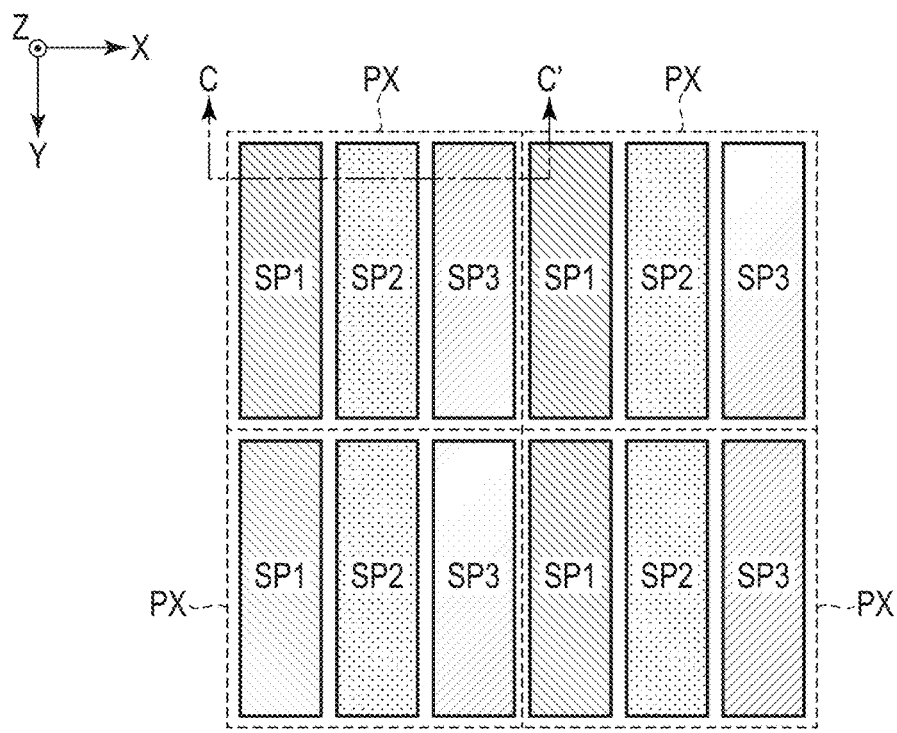
FIG. 20 is a diagram showing an example of a layout of sub-pixels included in each of pixels of a display device according to a second embodiment.

FIG. 20 is a diagram showing an example of a layout of sub-pixels included in each of the pixels PX. The layout will be described by assuming that the number of pixels PX is four.

The sub-pixels SP1, SP2 and SP3 constituting one pixel PX are each formed in a substantially rectangular shape extending in the second direction Y, and are arranged in the first direction X. Paying attention to two pixels PX arranged in the first direction X, the display colors of adjacent sub-pixels are different from each other. Paying attention to two pixels PX arranged in the second direction Y, the display colors of adjacent sub-pixels are the same. The areas of the sub-pixel SP1, SP2 and SP3 may be the same or different from each other.

Figure 21:
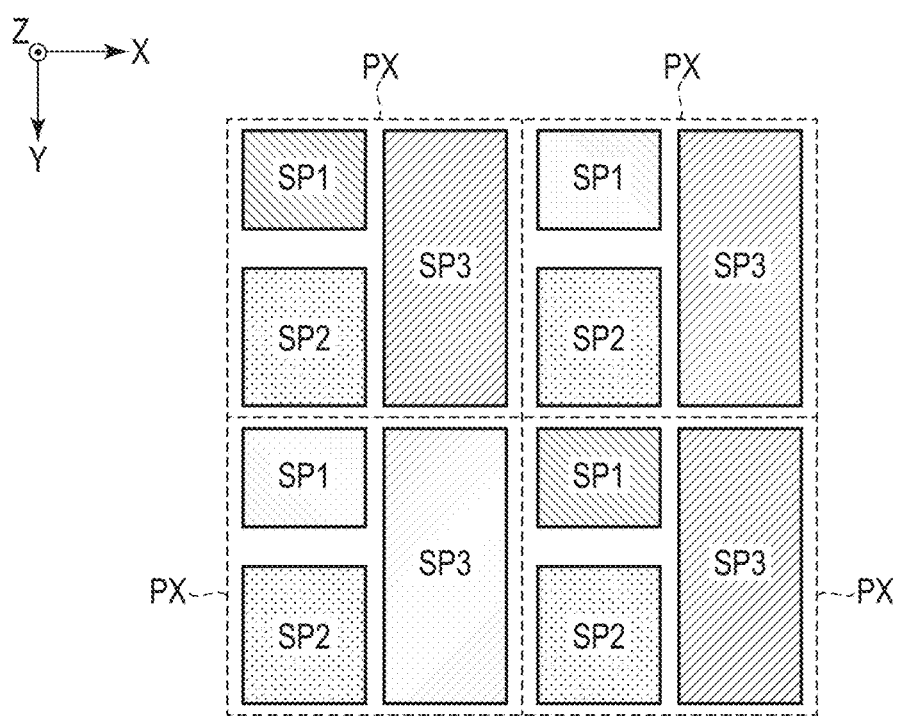
FIG. 21 is a diagram showing another example of the layout of sub-pixels included in the pixel.

FIG. 21 is a diagram showing another example of the layout of sub-pixels included in each of the pixels PX. The sub-pixels SP1 and SP2 constituting one pixel PX are arranged in the second direction Y, the sub-pixels SP1 and SP3 are arranged in the first direction X, and the sub-pixels SP2 and SP3 are arranged in the first direction X. The sub-pixel SP1 is formed in a substantially rectangular shape extending in the first direction X, and the sub-pixels SP2 and SP3 are formed in a substantially rectangular shape extending in the second direction Y. The area of the sub-pixel SP2 is larger than that of the sub-pixel SP1, and the area of the sub-pixel SP3 is larger than that of the sub-pixel SP2. Note that the area of the sub-pixel SP1 may be the same as that of the sub-pixel SP2.

Paying attention to two pixels PX arranged in the first direction X, the display colors of adjacent sub-pixels are different from each other in an area where the sub-pixels SP1 and SP3 are alternately arranged and an area where the sub-pixels SP2 and SP3 are alternately arranged.

Paying attention to two pixels PX arranged in the second direction Y, the display colors of adjacent sub-pixels are different from each other in an area where the sub-pixels SP1 and SP2 are alternately arranged. In an area where a plurality of sub-pixels SP3 are arranged, the display colors of adjacent sub-pixels are the same.

The outer shape of each of the sub-pixels shown in FIGS. 20 and 21 corresponds to, for example, that of the anode electrode AD of the display element 20 or that of the light-emitting area (opening OP) of the display element 20. However, FIGS. 20 and 21 simply illustrate the layout of the sub-pixels SP1, SP2 and SP3, and do not necessarily reflect the actual shape thereof.

Figure 22:
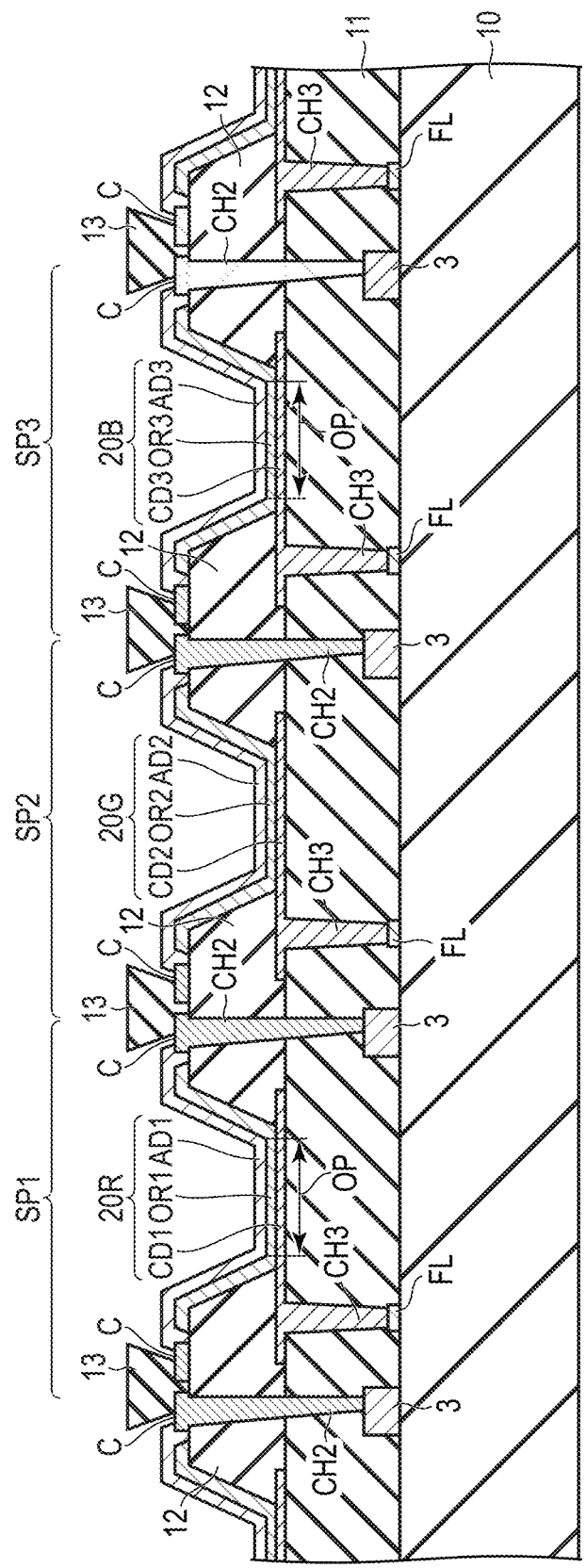
FIG. 22 is a schematic sectional view of the display device taken along the line C-C' in FIG. 20.

FIG. 22 is a schematic sectional view of the display device DSP along the line C-C' in FIG. 20. In the foregoing first embodiment, the display element 20 includes a cathode electrode CD, an organic layer OR and an anode electrode AD, and the organic layer OR includes a light-emitting layer that emits light of the same color (all the pixels PX display the same color). In the second embodiment, the display device DSP includes organic layers OR1, OR2 and OR3 including light-emitting layers that emit light of different colors.

Specifically, the organic layer OR1 includes a light-emitting layer that emits, for example, red light, and the light-emitting layer is formed in an area superposed on the sub-pixel SP1. The organic layer OR1 is formed on a cathode electrode CD1 placed alongside the array substrate 10 and is covered with an anode electrode AD1. The cathode electrode CD1, organic layer OR1 and anode electrode AD1 correspond to the display elements 20R of the sub-pixel SP1.

The organic layer OR2 includes a light-emitting layer that emits, for example, green light, and the light-emitting layer is formed in an area superposed on the sub-pixel SP2. The organic layer OR2 is formed on a cathode electrode CD2 placed alongside the array substrate 10 and is covered with an anode electrode AD2. The cathode electrode CD2, organic layer OR2 and anode electrode AD2 correspond to the display elements 20G of the sub-pixel SP2.

The organic layer OR3 includes a light-emitting layer that emits, for example, blue light, and the light-emitting layer is formed in an area superposed on the sub-pixel SP3. The organic layer OR3 is formed on a cathode electrode CD3 placed alongside the array substrate 10 and is covered with an anode electrode AD3. The cathode electrode CD3, organic layer OR3 and anode electrode AD3 correspond to the display elements 20D of the sub-pixel SP3.

The anode electrodes AD1, AD2 and AD3 are connected to the driving transistors 3 which are provided for the sub-pixels SP1, SP2 and SP3 via the contact holes CH2, respectively in the same manner as in the first embodiment. A detailed description thereof will be omitted here.

In the second embodiment, as shown in FIG. 5, the cathode electrode CD may be formed all over a plurality of pixels PX (Sub-Pixels SP1, SP2 and SP3) arranged in the display are DA, but in FIG. 22, an example is shown in which the cathode electrode CD is divided into cathode electrodes CD1, CD2 and CD3 each corresponding to a sub-pixel. In this case, each of the cathode electrodes CD1, CD2 and CD3 has only to be connected to the feeding line FL via a contact hole CH3 formed in the insulating layer 11 superposed on an area where the sub-pixels SP1, SP2 and SP3 are placed.

It has been described that the cathode electrode CD is divided into cathode electrodes CD1, CD2 and CD3 each corresponding to a sub-pixel. The cathode electrode CD1 may be formed in common to, for example, a plurality of sub-pixels SP1. Similarly, the cathode electrode CD2 may be formed in common to a plurality of sub-pixels SP2, and the cathode electrode CD3 may be formed in common to the plurality of sub-pixels SP3. That is, in the second embodiment, the cathode electrodes CD1, CD2 and CD3 may be provided for their respective light-emitting colors (display colors) of the organic layer.

In the above configuration, different voltages corresponding to display colors can be applied to the cathode electrodes CD1, CD2 and CD3.

In the second embodiment, furthermore, the cathode electrode and the anode electrode may be replaced with each other in at least one of the sub-pixels SP1, SP2 and SP3. This configuration makes it possible to adopt an optimum stacked structure for each of the sub-pixels SP1, SP2 and SP3 in accordance with the light-emitting colors of the organic layer.

For example, in the sub-pixel SP3 that displays blue color, the driving of the display element 20B (organic layer OR3) may be more unstable that in the other sub-pixels SP1 and SP2. In order to improve the resistance of the organic layer OR3 to environment in the sub-pixel SP3, the cathode electrode CD3 can be placed alongside the array substrate 10. If the cathode electrode is placed alongside the array substrate 10, the driving efficiency (light-emitting efficiency) of the display element 20 may be reduced. In the sub-pixels SP1 and SP2, therefore, the anode electrodes AD1 and AD2 can be placed alongside the array substrate 10. FIG. 23 shows a configuration in which the cathode electrode CD3 is placed alongside the array substrate 10 in the sub-pixel SP3 and the anode electrodes AD1 and AD2 are placed alongside the array substrate 10 in the sub-pixels SP1 and SP2, as described above.

In the process of forming an organic layer for each light-emitting color, it is assumed that, for example, the organic layer OR1 that emits red light is formed first. The organic layer OR1 may be affected by outside air and the like while the other organic layers OR2 and OR3 are formed. In this case, for example, in the sub-pixel SP1, the cathode electrode CD1 may be placed alongside the array substrate 10 to improve resistance to environment.

According to each of the above embodiments, a display device capable of achieving high resistance to environment can be provided.

All display devices, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A display device comprising:
a base;
a driving transistor placed on the base;
a first insulating layer placed on the driving transistor;
a cathode electrode placed on the first insulating layer;
a light-emitting layer placed on the cathode electrode;
an anode electrode that covers the light-emitting layer;
a second insulating layer placed on the first insulating layer and including an opening superposed on the cathode electrode; and
a wall placed on the second insulating layer,
wherein the anode electrode is electrically connected to the driving transistor through a first contact hole formed in the first insulating layer and the second insulating layer, and
the wall superposes the first contact hole.

2. The display device of claim 1, wherein the wall is shaped with an upper portion thereof wider than a lower portion thereof.

3. The display device of claim 2, wherein the wall is further shaped symmetrical with regard to a normal direction of a main surface of the base.

4. The display device of claim 2, wherein the wall is further shaped asymmetrical with regard to a normal direction of a main surface of the base.

5. The display device of claim 1, wherein:
the anode electrode is connected to a connection electrode placed to surround the light-emitting layer in planar view; and
the connection electrode is connected to the driving transistor through the first contact hole.

6. The display device of claim 5, wherein the light-emitting layer is apart from the connection electrode.

7. The display device of claim 1, wherein the cathode electrode is connected to a line that applies a voltage to the cathode electrode through a second contact hole formed in the first insulating layer superposed on a surrounding area where no pixels are arranged.

8. The display device of claim 1, wherein the cathode electrode is connected to a line that applies a voltage to the cathode electrode through a second contact hole formed in the first insulating layer superposed on a display area where pixels are arranged.

9. The display device of claim 1, further comprising an insulating member that covers an end portion of the cathode electrode which is opposed to the first contact hole.

10. The display device of claim 1, further comprising an insulating member that covers an inner surface of the first contact hole.

11. The display device of claim 1, wherein:
the cathode electrode is placed on the first insulating layer and the anode electrode covers the light-emitting layer in an area superposed on a first pixel; and
the anode electrode is placed on the first insulating layer and the cathode electrode covers the light-emitting layer in an area superposed on a second pixel other than the first pixel.

12. The display device of claim 11, wherein:
a first voltage is applied to the cathode electrode placed on the first insulating layer in the area superposed on the first pixel; and
a second voltage is applied to the cathode electrode covering the light-emitting layer in the area superposed on the second pixel.

13. The display device of claim 11, wherein the light-emitting layer placed in the area superposed on the first pixel and the light-emitting layer placed in the area superposed on the second pixel include light-emitting layers that emit light of a same color.

14. The display device of claim 11, wherein the light-emitting layer placed in the area superposed on the first pixel and the light-emitting layer placed in the area superposed on the second pixel include light-emitting layers that emit light of different colors.

* * * * *